United States Patent
Coronel et al.

(10) Patent No.: US 9,646,846 B2
(45) Date of Patent: May 9, 2017

(54) METHOD FOR PRODUCING A MULTILEVEL MICROELECTRONIC STRUCTURE

(71) Applicant: Commissariat A L'Energie Atomique et aux Energies Alternatives, Paris (FR)

(72) Inventors: Philippe Coronel, Barraux (FR); Claire Fenouillet-Beranger, Voiron (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/865,792

(22) Filed: Sep. 25, 2015

(65) Prior Publication Data

US 2016/0093504 A1  Mar. 31, 2016

(30) Foreign Application Priority Data

Sep. 25, 2014 (FR) ..................... 14 59059

(51) Int. Cl.
*H01L 21/3105* (2006.01)
*H01L 27/06* (2006.01)
*H01L 21/822* (2006.01)

(52) U.S. Cl.
CPC ...... *H01L 21/3105* (2013.01); *H01L 21/8221* (2013.01); *H01L 27/0688* (2013.01)

(58) Field of Classification Search
CPC ............. H01L 21/8221; H01L 27/0688; H01L 21/02381; H01L 21/02505;
(Continued)

(56) References Cited

U.S. PATENT DOCUMENTS 6,856,225 B1    2/2005  Chua et al.
2003/0020090 A1  1/2003  Heck et al.
(Continued)

FOREIGN PATENT DOCUMENTS

FR    2 894 069 A1    6/2007

OTHER PUBLICATIONS

French Preliminary Search Report issued May 20, 2015 in French Application 14 59059, filed on Sep. 25, 2014 ( with English Translation of Categories of Cited Documents and Written Opinion).

(Continued)

*Primary Examiner* — Caleen Sullivan
(74) *Attorney, Agent, or Firm* — Oblon, McClelland, Maier & Neustadt

(57) ABSTRACT

A method for producing a multilevel microelectronic structure includes formation of a first layer, production of at least one second layer at least partially covering the first layer, and production of at least one microelectronic pattern on or in the second layer. The second layer is formed so as to generate a mechanical stress in it, the first layer forms, for the second layer, a support preventing relaxation of the stress. After the production of at least one microelectronic pattern, the method includes at least elimination of at least part of the first layer, thus making it possible to relax at least part of the mechanical stress on the second layer so that at least a portion of the second layer covering the eliminated part of the first layer moves, and fixing the moved portion of the second layer to a structure part that has remained fixed.

31 Claims, 14 Drawing Sheets

(58) Field of Classification Search
CPC ......... H01L 21/02513; H01L 21/76897; H01L 21/76898; H01L 21/3105
USPC ....................................................... 438/761
See application file for complete search history.

(56) References Cited

U.S. PATENT DOCUMENTS

| | | |
|---|---|---|
| 2003/0027081 A1 | 2/2003 | Chua et al. |
| 2003/0179064 A1 | 9/2003 | Chua et al. |
| 2005/0118733 A1 | 6/2005 | Schmidt et al. |
| 2005/0270135 A1 | 12/2005 | Chua et al. |
| 2007/0122975 A1 | 5/2007 | Coronel et al. |
| 2014/0234977 A1 | 8/2014 | Grimm et al. |

OTHER PUBLICATIONS

Francesca Cavallo et al. "Semiconductors turn soft: inorganic nanomembranes", Soft Matter, vol. 6, No. 3, 2010, 18 pages.

Arthur Bertrand et al. "Routes to Hydrogen Bonding Chain-End Functionalized Polymers", Macromolecular Journals, 2012, 30 pages.

Severine Rose et al. "Nanoparticle solutions as adhesives for gels and biological tissues", Nature Letter, vol. 505, 2014, 11 pages.

H Qin et al "Formation of microtubes from strained SiGe/Si heterostructures", New journal of Physics, vol. 7, 2005, 10 pages.

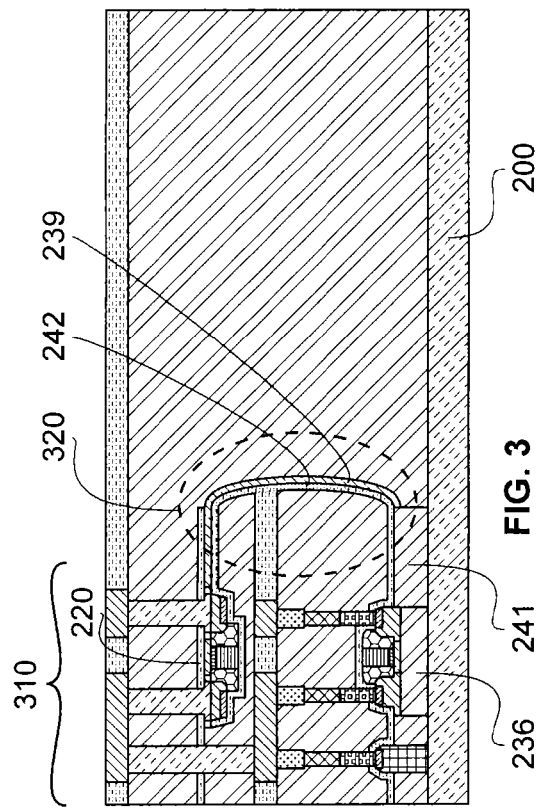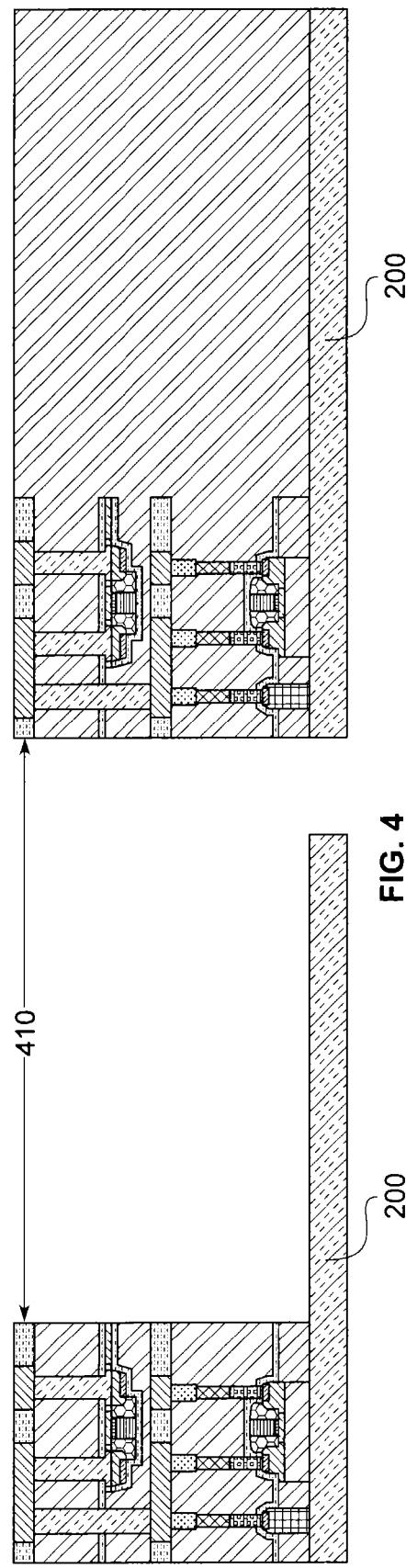

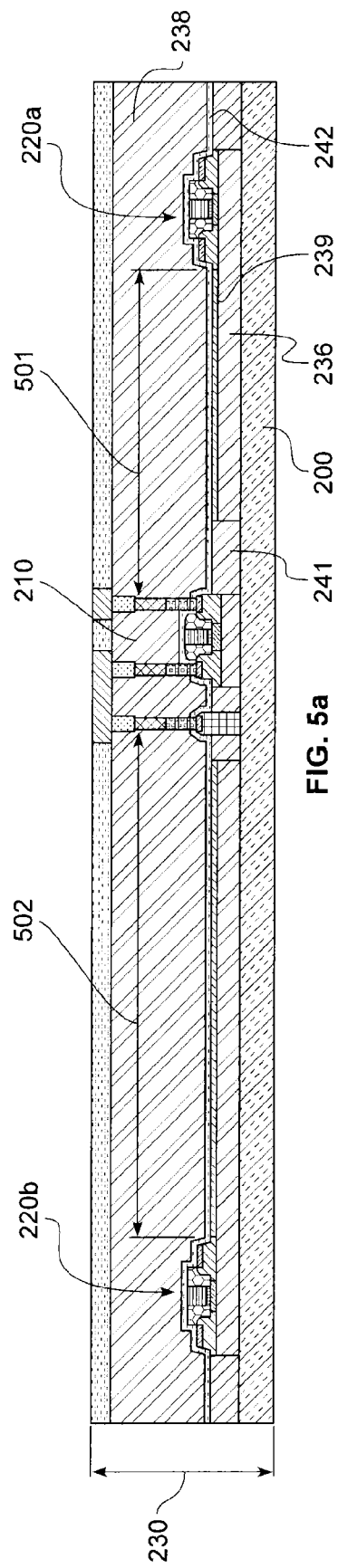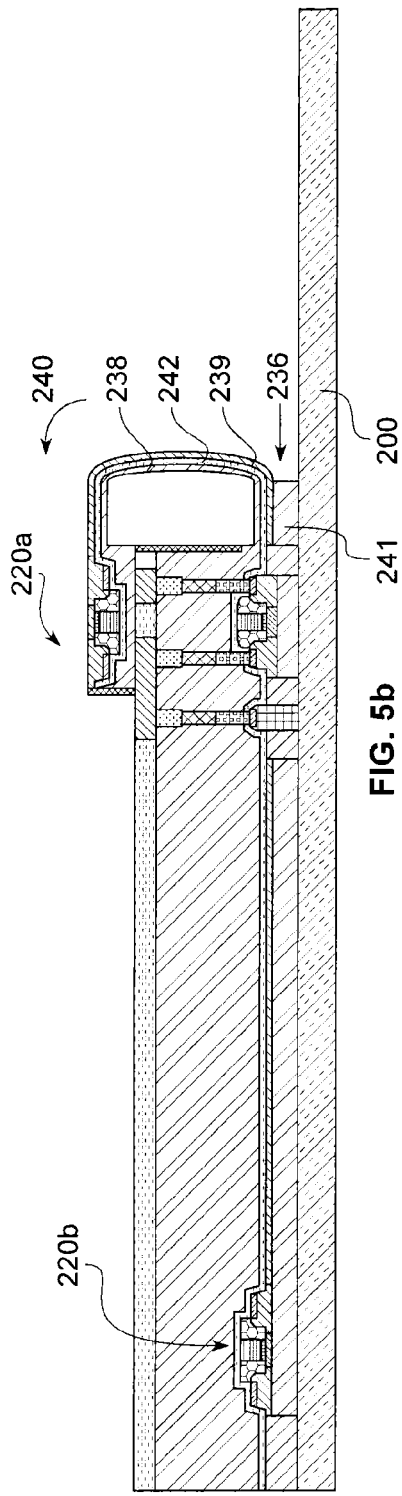
FIG. 5a
FIG. 5b

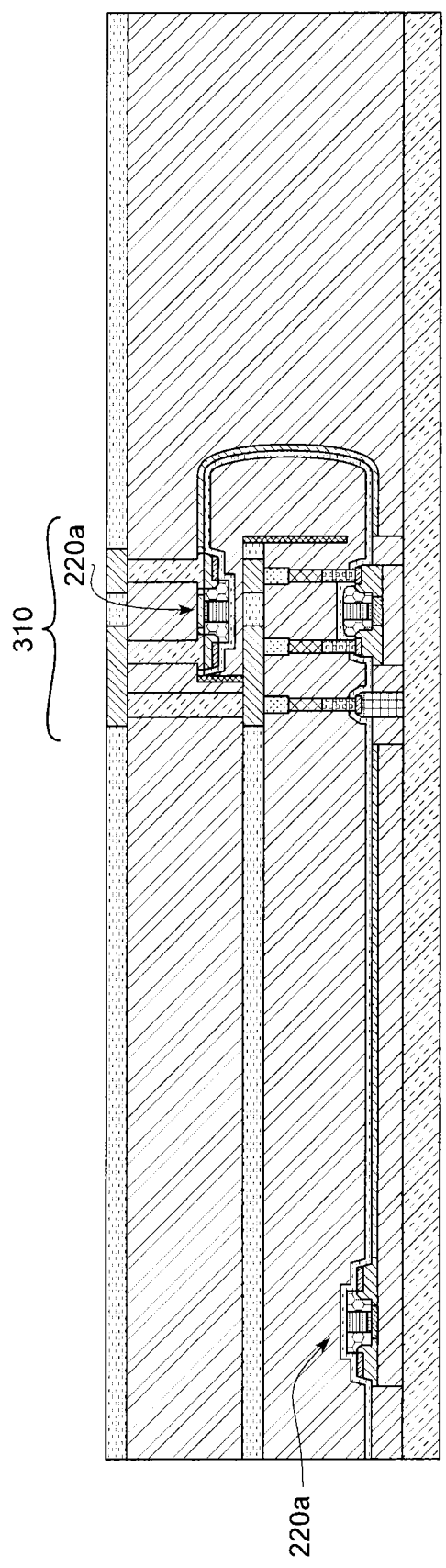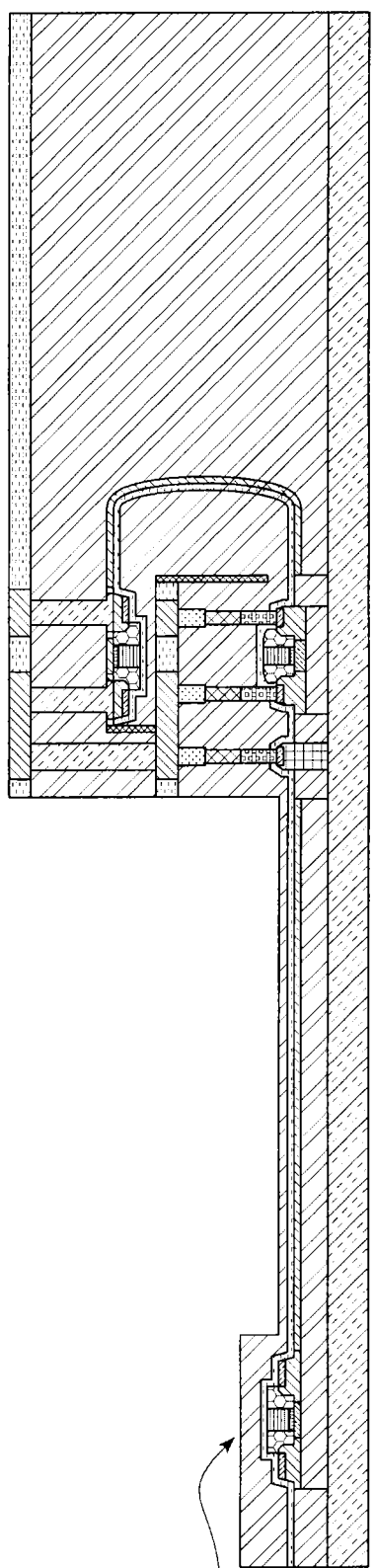

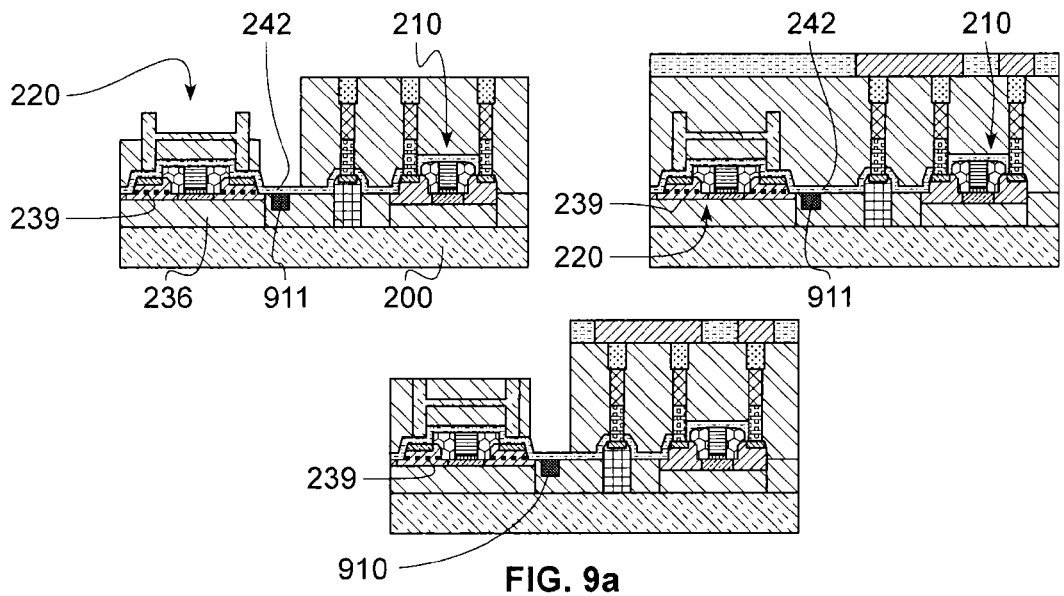
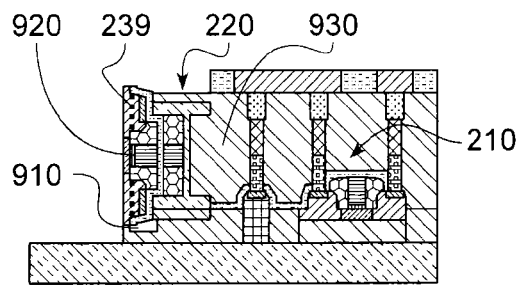
FIG. 9b
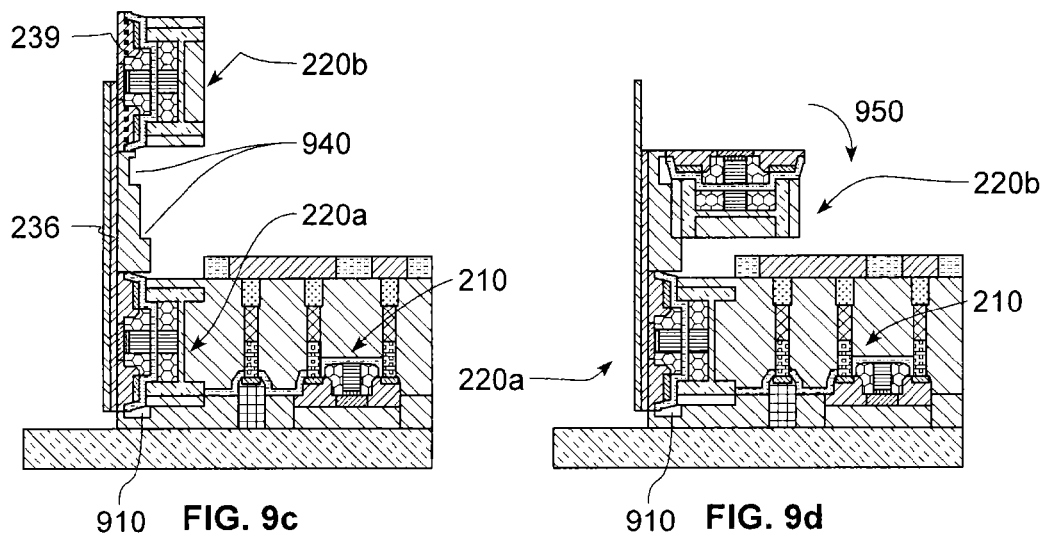

METHOD FOR PRODUCING A MULTILEVEL MICROELECTRONIC STRUCTURE

TECHNICAL FIELD OF THE INVENTION

The present invention relates to methods for producing microelectronic structures and in particular methods for producing three-dimensional (3D) structures, methods at the end of which a plurality of levels of components are stacked.

PRIOR ART

In general, producing three-dimensional or 3D structures makes it possible to increase the density of integration of the microelectronic devices thus manufactured.

Among the solutions that have already been proposed for obtaining this result, the technique that is by far the most often used consists of successively producing the various layers of the 3D stack forming the microelectronic device that it is wished to manufacture. In this way first of all a first level is produced comprising some of the microelectronic components, and then, on this first level, during a second production phase, a second level of components constituting the device is superimposed. More than two levels can be successively produced in this way.

However, when such a 3D structure is produced, some steps require high temperatures. This is in particular the case with the production of active components such as transistors. For example, the step of producing the stack of layers forming the gate electrode of such transistors will typically require the use of temperatures of around 800° C. The temperatures applied to the 3D structure during manufacture for producing the levels beyond the first are, in this embodiment, necessarily also applied to the levels already produced and in particular to the first level.

However, some of the components of the first level, and more generally of the levels already produced, are liable to have only a small thermal budget, that is to say they cannot absorb a high thermal energy, otherwise they will be greatly degraded. This is for example the case with the regions forming the source and drain (S/D) electrodes of the transistors already produced, in particular since they are usually silicided for the purpose of reducing the electrical resistance of these electrodes.

Use of the technique for manufacturing 3D devices briefly described above, the most frequently used, therefore in practice requires having recourse to production steps, for the second level and if applicable the following ones, that involves only fairly low temperatures so that they do not cause degradation of the components already produced. Typically, producing a second level of components then requires the use of temperatures not exceeding 400° C. With this thermal budget it is however necessary always to be able to create at this level active components generally of the MOS transistor type, that is to say "metal-oxide-semiconductor", the most widely used, on an earth plane and with electrical insulation between transistors. Though solutions have indeed been proposed for achieving this result, they prove to be particularly complex to implement or lack reliability for being exploited industrially. The problem is posed in particular for obtaining gate oxides and epitaxial layers necessary for producing MOS transistors, the quality of which degrade substantially when they are formed below 500° C. Equally, the problem of the diffusion, at these temperatures, of dopants in the semiconductor layers is not solved.

One object of the invention is therefore to respond at least partly to the above-disclosed problems that are posed when producing the higher levels of stacks of 3D components.

The other objects, features and advantages of the present invention will emerge from an examination of the following description and the accompanying drawings. Naturally other advantages may be incorporated.

SUMMARY OF THE INVENTION

To achieve this objective, one embodiment of the present invention proposes a method for producing a microelectronic structure, comprising:
  the formation of a first layer;
  the production of at least one second layer at least partially covering the first layer;
  the production of at least one microelectronic pattern on or in the second layer.

The second layer is formed so as to generate a mechanical stress in it, and the first layer forming for the second layer a support preventing relaxation of said stress.

The method comprises at least the following steps performed after the production of at least one microelectronic pattern,
  eliminating at least part of the first layer, thus allowing relaxation of at least part of said stress and enabling a portion of the second layer covering said eliminated part of the first layer to move under the effect of said stress;
  fixing the moved portion to a fixed remaining part of the structure.

Thus the invention makes it possible to produce microelectronic patterns on the same level and then to deform this level in order to assemble these patterns in the space, for example by stacking them on various levels. More precisely, a portion of a level moves, typically by curving or folding, under the effect of the release of the stress that it previously contained. The stress is released when the first layer that serves as a sacrificial layer is removed. The patterns being formed on the same level, the invention avoids impacting the thermal budget of a first level when higher levels are produced.

According to another embodiment, the invention relates to a method for producing a microelectronic structure from a stack comprising at least one first layer, a second layer covering the first layer, and at least one electronic module such as a microelectronic pattern on or in the second layer.

The method comprises at least one step during which a stress in the second layer is created in the stack, the first layer preventing the relaxation of said stress.

The method also comprises at least the following steps performed using said stack:
  eliminating at least part of the first layer in order thus to allow relaxation of the stress holding the second layer against the first layer. Said relaxation enabling a portion of the second layer covering said eliminated part of the first layer to move under the effect of said stress;
  fixing the moved portion on a fixed remaining part of the structure.

Thus the second layer carries or constitutes a movable module that moves by coiling until it comes into contact with a module that has remained immobile.

Another subject matter of the present invention relates to a microelectronic device comprising a structure obtained by the method according to the invention. Microelectronic device means any type of device produced with microelectronic means. These devices encompass in particular, in addition to devices with a purely electronic purpose, micromechanical or electromechanical devices (MEMS, NEMS, etc.) as well as optical or optoelectronic devices (MOEMS, etc.).

BRIEF DESCRIPTION OF THE FIGURES

The aims, objects, features and advantages of the invention will emerge more clearly from the detailed description of an embodiment thereof that is illustrated by the following accompanying drawings, in which:

FIG. 3 illustrates an implementation of the invention in which the contacts on the transistors in the top layer are made, after turning over, from the bottom face thereof.

FIG. 4 illustrates how the 3D blocks may, after folding, be isolated from each other.

FIG. 9, composed of FIGS. 9a to 9d, illustrates the use of notches configured to control the foldings.

Figure 1:
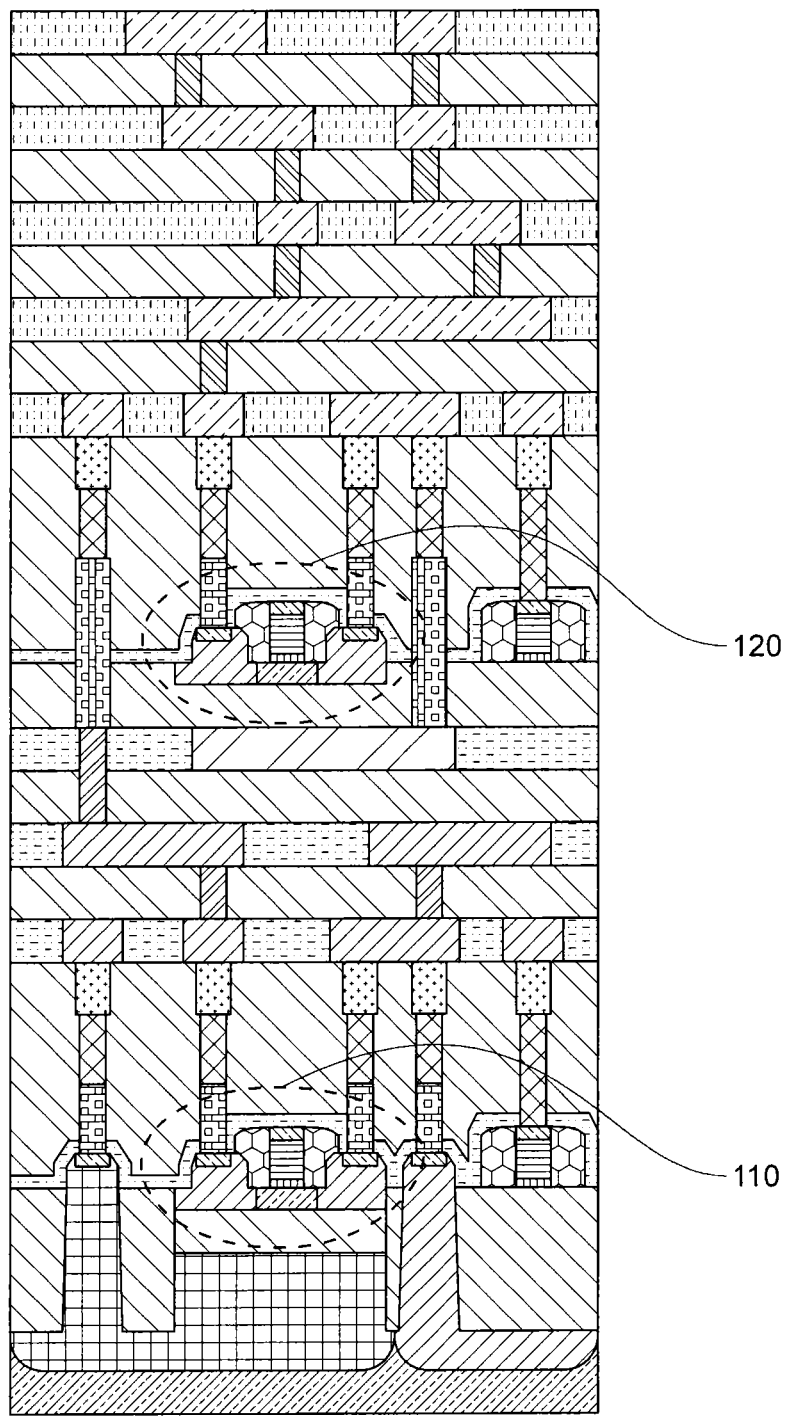
FIG. 1 illustrates an example embodiment of a multilevel structure of the prior art.

The drawings are given by way of examples and are not limitative of the invention. They constitute schematic outline representations intended to facilitate understanding of the invention and are not necessarily to the scale of practical applications. In particular the relative thicknesses, lengths and positions of the various components, layers and films do not represent reality.

DETAILED DESCRIPTION OF THE INVENTION

Before beginning a detailed review of embodiments of the invention, optional features, which may optionally be used in association or alternatively, are stated below:

prior to the elimination step, at least one discontinuity is produced in the second layer, configured so as to control the positioning of the moved portion of the second layer on the fixed remaining part of the structure;

at least one discontinuity blocks the movement of the moved portion of the second layer;

at least one discontinuity defines a centre of rotation about which the moved portion of the second layer turns when it moves;

at least one discontinuity forms at least one notch;

at least one discontinuity forms at least one notch between the pattern and the structure part intended to remain fixed, and in which said at least one notch forms a stop configured so as to block the movement of said moved part of the second layer;

the at least one notch forms a trench;

the portion of the second layer (situated on said eliminated part of the first layer moves in curving under the effect of the relaxation of said stress;

the second layer comprises a microelectronic pattern on the moved portion or on a portion that has remained fixed;

the second layer is surmounted by an insulating layer, configured so as to allow itself to be moved by the movement of the second layer;

the second insulating layer is surmounted by a semiconductor layer, configured so as to allow itself to be moved by the movement of the second layer;

the second layer is a semiconductor layer;

the moved portion curves in the direction of the portion that has remained fixed;

the moved portion curves by an angle of between 60° and 270° and preferably between 80° and 190°;

the second layer comprises at least one first microelectronic pattern (a microelectronic component for example such as a transistor) on said moved portion of the second layer and at least one second microelectronic pattern (a microelectronic component for example such as a transistor) on a portion of the second layer that has remained fixed. At the end of the fixing of said moved portion of the second layer to the part of the structure that has remained fixed, the first and second patterns are superimposed;

the moved portion comprises at least one transistor active component;

the moved portion comprises at least one component taken from the following components: a logic component, a memory cell, an electromechanical microsystem (MEMS), a nanometric electromechanical system, a sensor, an imager, a laboratory on chip (normally referred to by its English term "lab on chip"), a photonic component, an acoustic component, a phononic component or a bioelectronic component;

the moved portion comprises at least one component configured so as to fulfil at least one of the following functions: a logic function, a memory function, an electromechanical microsystem (MEMS) function, a nanometric electromechanical system function, a sensor function, an imager function, a laboratory on chip (normally referred to by its English term "lab on chip") function, a photonic function, an acoustic function, a phononic function or a bioelectronic function;

the portion that has remained fixed comprises at least one transistor;

the transistor carried by the removed portion is attached to the rest of the structure, forming an angle of between 80° and 190° with respect to its initial position;

the positioning of the moved portion with the structure part that has remained fixed is partly controlled at least by the size of the part of the first layer that has been eliminated. The elimination of the part of the first layer is obtained by etching controlled by time. Thus the positioning of the moved portion to the structure part that has remained fixed is partly controlled by at least the etching time for the first layer.

The advantage of this embodiment is being particularly simple to implement.

Advantageously, the material of the sacrificial layer (the first layer) is chosen so that it is selective relative to all the other materials that will see the plasma or solution when the sacrificial layer is removed. A film of oxide with $CHF_3$—$CF_4$ chemistry can be used in the same way as epitaxed SiGe or doped polySiGe.

As an alternative to the etching time, an etching can also be provided with detection of the end of etching. This requires for example having a predefined chamber for the material to be eliminated.

Alternatively or in a complementary, at least one discontinuity is provided in the second layer, the position and size in particular of the discontinuity being chosen so as to control the positioning of the portion moved to the structure part that has remained fixed. For example, according to its position, the discontinuity blocks the movement. It can also control the centre of the rotation about which the second portion curves when it moved. Preferably, the discontinuity forms a notch or a trench. It is for example obtained by forming a cavity in the second layer (by lithography typically) and then by filling the cavity with a dielectric.

The advantage of this embodiment is allowing great precision of positioning.

It is also possible to have recourse to an alternative embodiment in which the second layer is deposited in a solid sheet or a selective growth and then photolithography specifies the region where the second layer must remain.

Alternatively or in a complementary, the positioning of the moved portion on the structure part that has remained fixed is controlled partly at least by self-positioning by affinity of material. This technique is also referred to as "self-aligned monolayer".

According to one embodiment, the fixing of the moved portion to the structure that has remained fixed is based at least partly on self-healing of the layers in contact.

According to one embodiment, the fixing of the moved portion to the structure part that has remained fixed is based partly on at least a recreation of hydrogen bonds at the layers in contact.

According to one embodiment, the fixing of the moved portion to the structure that has remained fixed is at least partly based on a flow of the layers in contact.

The fixing techniques mentioned above, self-healing, the association of polymers by hydrogen bonds and flow have numerous advantages, including in particular the following:

the association takes place at low temperature;

the materials are compatible with those of microelectronics;

these polymers and gels allow planarisation and therefore adjustment;

if regions are provided with and without the two faces to be fixed, alignment of better precision will be allowed. For some gels it will be possible to go as far as recognition of particular function/bonding for self-alignment in the plane x, y and along the z axis;

the particular points for using these techniques will be conventional and widely used machines, for example spin-on, or even machines of the Langmuir type for interface monolayers (such as silica particles);

the temperatures used do not need to be high. They allow the use of low-temperature pressing systems. The temperature will be a little higher for flow. For example 400° C. for PGS and BPSG classes.

Alternatively or in a complementary, the fixing of the moved portion on the structure part that has remained fixed is based at least partly on attraction forces, for example van der Waals.

Moreover, in order to assist the interaction between the two layers, a step of nanoembossing between the second layer and the structure that has remained fixed and on which the second layer is fixed can be performed.

Alternatively or in a complementary, the moved portion of the second layer includes or carries a microelectronic pattern and the fixing step comprises a step of penetration of said pattern in a deformable layer carried by the rest of the structure, that is to say by the part of the structure that has remained fixed.

The penetration step comprises an impression step applied to the moved portion so as to make said pattern penetrate the deformable layer.

The first layer, that is to say the stressed layer, can be either a monolayer or a multilayer.

At least first and second patterns are produced on the second layer, said part intended to remain fixed and the first and second patterns being aligned and in which the first and second patterns are moved successively on said part intended to remain fixed.

At least first and second patterns are produced on the second layer, said part intended to remain fixed and the first and second patterns being aligned, the first and second patterns being disposed on either side of said part intended to remain fixed and at different distances from the latter.

At least first and second patterns are produced on the second layer, said part intended to remain fixed and the first and second patterns being aligned, the first and second patterns being disposed on the same side of said part intended to remain fixed and at different distances from the latter.

At least first and second patterns are produced on the second layer, and wherein movements of the first and second patterns are made in different planes.

Both a first layer and a second layer are disposed on each of the two opposite faces of a support layer and wherein the elimination of the first layers causes the movement of the second layers in the same plane, in two different directions and on either side of the support layer.

At least one notch is produced in the second layer between the pattern and the structure part intended to remain fixed. Preferably said notch forms a stop configured so as to block the movement of said moved part of the second layer.

The structure intended to remain fixed is produced at least one contact pin configured so as to block the movement of the second layer produced in the structure intended to remain fixed. The pin serves as a stop configured so as to block the movement of the second layer.

Depending on the mesh of the first layer, the second layer will be stressed to a greater or lesser extent. The mesh depends firstly on the nature of the material. It may also depend on its thickness and on the crystalline lattice below.

The second layer covers the first layer while being disposed on or under the first layer.

According to one embodiment, the second layer covers the first layer while being directly in contact with the first layer. Alternatively, the second layer is disposed on or under the first layer, being separated from the first layer by means of an intermediate layer that is eliminated when the first layer is removed or which moves with the second layer;

A microelectronic pattern is taken from:
  a transistor;
  one of more interconnection blocks;
  the doping of a portion of layer;
  the production of a hollow or projecting shape (cavity, gate, S/D via, connection, pin).

More generally, in the context of the present invention, any microelectronic pattern concerns any pattern having a function in the microelectronics or microsystems field.

The pattern may for example be one or a combination of the following components: a logic component, a memory cell, an electromechanical microsystem (MEMS), a nanometric electromechanical system, a sensor, an imager, a lab on chip, a photonic component, an acoustic component, a phononic component or a bioelectronic component.

"Structure intended to remain fixed" means the structure that is not removed under the effect of the relaxation of the stress. This structure does not comprise an underlying sacrificial layer that is eliminated. It may nevertheless comprise a portion of the sacrificial layer that is not eliminated and remains in place. This structure preferably constitutes the base, or the lowest level, of the multilevel structure that it is wished to obtain. It comprises or not a microelectronic pattern.

In the context of the present invention, the term "on", "surmounts", "covers" or "underlying" or the equivalents thereof do not mean "in contact with". Thus, for example, the deposition of a first layer on a second layer does not necessarily mean that the two layers are directly in contact with each other but means that the first layer at least partially covers the second layer while being either directly in contact therewith or being separated therefrom by at least one other layer or at least one other element.

In the context of the present invention, the expression "fixed to" does not imply any limitation as to direction or position of fixing. It indicates solely that two elements are fixed to each other.

In the present patent application, the thickness is taken in a direction perpendicular to the main faces of the substrate on which the various layers rest. In the figures, the thickness is taken vertically.

Several non-limitative examples of the invention will now be described.

FIG. 1 illustrates and summarises the problems posed by the production of a 3D structure according to a method of the prior art as described briefly in the part on the prior art, where the various levels 110, 120 of a 3D device are produced successively.

The production at low temperature (400° C.) of a second level of active components, that is to say MOS transistors 110, including an earth plane and providing electrical insulation between the transistors, poses numerous problems:

The obtaining of good-quality epitaxis at low temperature proves to be difficult. It requires the use of novel precursors.
  The activation by laser of the semiconductor junctions is a known technique that does however suffer from problems of homogeneity.
  It is necessary to have recourse to cold isolation of MESA type to isolate the components. It is not possible to use the standard so-called STI (shallow trench isolation) technique, which is made dense at high temperature.
  The stacking of layers forming the gate (the gate stack) must be done cold but, in order to guarantee reliability of the gate oxide, it is however necessary to be able to produce an intermediate layer (an interlayer) hot, which requires rethinking the current integration scheme, etc.

FIGS. 2a to 2e illustrate the main steps of the method of the invention.

It should be noted here that, in all the following figures intended to illustrate the invention, the scales used to represent the horizontal and vertical dimensions are very different. In particular the vertical dimensions, those representing the thicknesses of the layers, use a much larger scale than the scale used for representing the horizontal dimensions of the patterns, that is to say the patterns created on the surface of the semiconductor trenches used to manufacture the microelectronic devices according to the method of the invention.

Figure 2A:
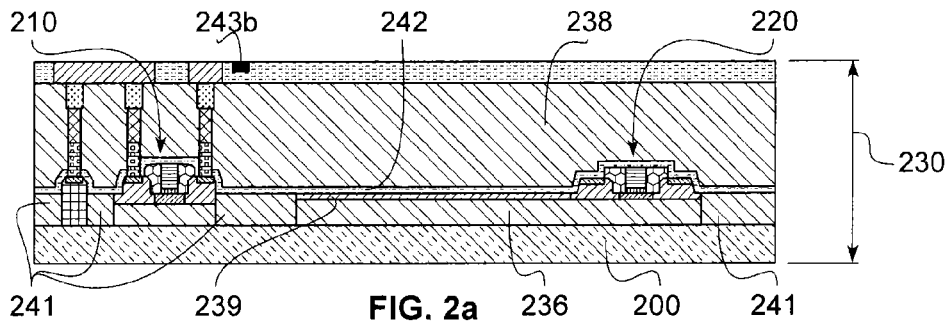
FIG. 2, composed of FIGS. 2a to 2e, illustrates various steps of an embodiment of the invention in which a microelectronic pattern is placed above another microelectronic pattern in order to form a 3D component structure.

The method of the invention solves the problems of the prior art by making it possible for all the active elements to be produced during a sequence of operations most suited to the actual performance of each active component, that is to say: Si, SiGe or Ge transistors or transistors based on composite semiconductors of the III-V type, thus benefiting from all the advantages of a standard method of producing MOS transistors. As illustrated in FIG. 2a, all the active components, 210 and 220, are then manufactured during a series of common steps on the same level 230 possibly, and without any drawback, using high temperatures (800° C.). It is thus possible to obtain optimum performances for each of the transistors, whatever the 3D level for which the component is finally intended. The components are formed in one or more isolating layers 238 and are supported by a common substrate 200.

According to one embodiment, the components are electrically isolated from one another by isolation trenches 241 of the STI (shallow trench isolation) type.

Figure 2B:
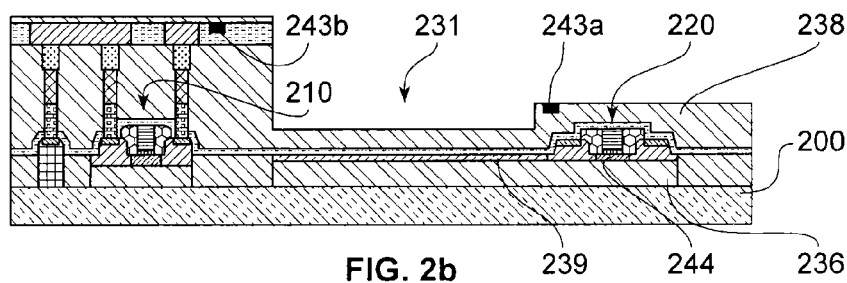

In the embodiment of the invention, as explained in FIG. 2b, the transistors such as 220 are intended to be folded in order to form a 3D stack. The structure of these MOS transistors can advantageously then be different from that of the transistors such as 210 intended to remain on the first level of the stack. An advantageous embodiment is more particularly described in FIG. 3.

The layer 242 surmounts the components 210, 220. This layer 242 is used conventionally as a stop layer for the etchings of the source, drain and gate contacts. Preferably, this layer 242 is made from nitride.

Figure 2C:
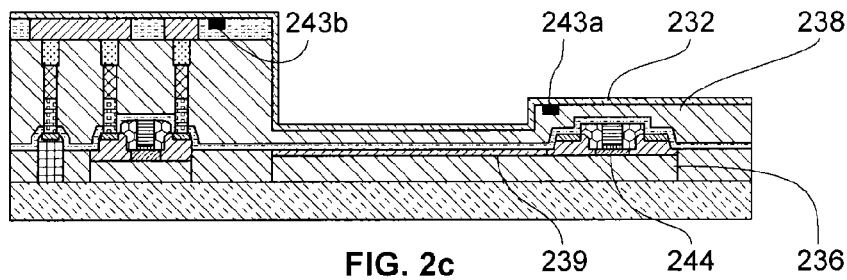

FIGS. 2b and 2c illustrate the preparation of the regions intended to be folded and in particular the creation by etching of a cavity forming a trench of finite length, that is to say a notching 231 and a suitable relief allowing folding. As shown in FIG. 2c, a layer 232 of a polycrystalline compound of SiGe (silicon-germanium) semiconductor materials is deposited over the entire surface. It is this layer 232 that serves as a hard mask for protecting the $SiO_2$ at the moment of removal of the layer 236, failing which all the oxide of the layers 236 and 238 would then be etched, which would be contrary to the effect sought.

Figure 2D:
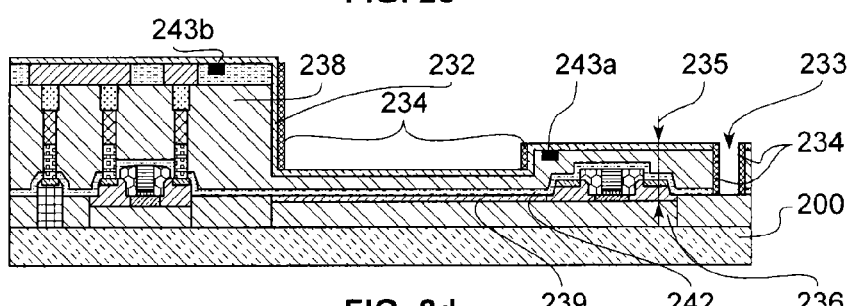

FIG. 2d shows the result, in the regions intended to be folded, of an HF etching of the trenches 233 for access to the underlying layers after these have been defined by photolithography in line with the isolation patterns 241, referred to as "STI", standing for "shallow trench isolation", specifying the technique normally used by the microelectronics industry for isolating the active components of a circuit. The formation of spacers 234, which serve as protections for the flanks of the patterns, should also be noted. They are made, as above, from a layer of SiGe that is left on the vertical flanks of the reliefs in the regions intended to be folded.

Thus the layers 234, 235 are aimed at protecting the layer 238 during the etching of the sacrificial layer 236. According to a preferred embodiment, 236 and 238 are made from the same material. The etching of the layer 236 is isotropic, as already mentioned; without the layers 234 and 235 the etching would therefore also remove 238, which is not sought.

Figure 2E:
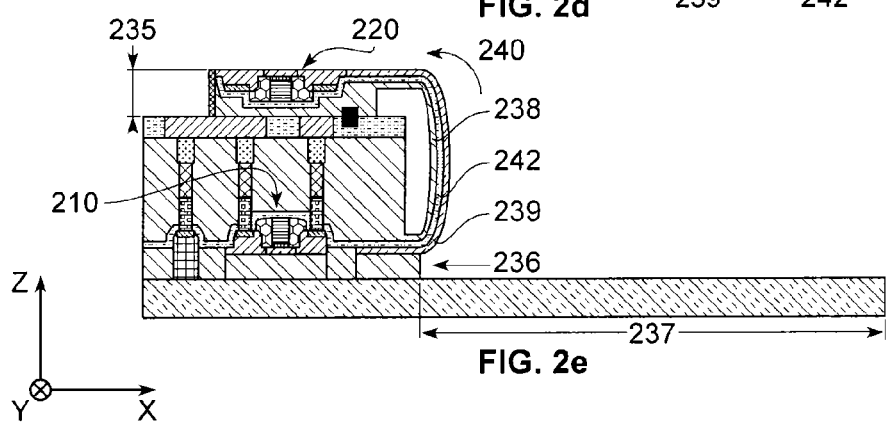

As shown in FIGS. 2d and 2e, it is then possible to proceed with the folding, turning over or coiling or "roll up" 240 of what then becomes the top layer 235 of the level 230. This folding is obtained during and at the end of a selective etching of the layer 236, using the previously formed trenches 233. The layer 236 is partially sacrificed over a width 237. This width is taken in the direction x of the reference frame illustrated in FIG. 2a. This elimination of the layer 236 relaxes the stress existing in the layer 239. This stress relaxation causes a folding of the layer 239 and of the top layers 235, which will thus constitute the second level of a 3D stack.

The techniques used for the folding or "roll up" of a thin layer of semiconductor such as for example silicon (Si) are known to a person skilled in the art. In general terms, arrangements are made to grow or deposit, on a sacrificial layer such as 236, one of more layers of semiconductor materials 239 in which mechanical stresses are created generally by associating semiconductor materials having different meshes. The etching of the underlying sacrificial layer releases the stresses, which then, as illustrated in FIG. 2e, causes a folding or roll up of the prestressed layers. In this regard reference can be made for example to the following publications:

"Thin solid films roll up into nanotubes", by Oliver G. Schmidt et al, published in "Nature", volume 410, dated 8 Mar. 2001.

"Semiconductors turn soft: inorganic nanomembranes" by F. Cavallo et al, published in "Soft Matter", volume 6, no. 3, in 2012, pages 425-692.

In FIG. 2e the vertical layers 232 and 234 are not shown for reasons of clarity.

It should be noted here that the position of the patterns after turning over is controlled by the length of the sacrificial layer that is removed. Since the etching of the sacrificial layer is isotropic, the folding is therefore controlled in terms of time.

Moreover, discontinuities, preferably in the form a notch 910 illustrated more particularly in FIG. 9, stop the curvature in order to control the point at which the distal end of the previously stressed layer 239 ends. Furthermore, these notches 910 also make it possible to better define the pivot point for the curvature. As illustrated in FIG. 9a, the notch 910 is for example made from a dielectric material.

The layer 239 and the layers that are connected to it are controlled and of finite length in the plane x, y. They will be driven by the movement force through the stress.

Moreover, it is possible to be assisted by alignment marks 243a, 243b that will have been produced in advance on the arm to be folded and on the structure that has remained fixed. Examples of alignment marks 243a, 243b are illustrated in FIGS. 2d and 2e respectively before and after fixing of the stressed layer 239 on the structure that has remained fixed. These alignment marks facilitate and control the positioning in the plane x, y of the structure connected to the stressed layer 239.

These alignment marks are illustrated and described in more detail with reference to FIG. 5f.

As will be described in more detail below, other solutions can be used as an alternative to or cumulatively with the solution involving notches for improving the precision of the positioning.

For example, it will be possible to provide holding pins forming stops blocking the movement of the movable part. It will also be possible to make provision for precisely sizing the length of the part that moves and the height of the part on which the movable part comes to be fixed.

Several methods used alternatively or cumulatively can be used for fixing the movable part on the structure part that has remained fixed.

According to one embodiment, the fixing of the moved portion on the structure part that has remained fixed is based partly at least on self-healing of the layers in contact.

The principle and the conditions of the use of this self-healing will be found for example in the following publication: "Nanoparticle solutions as adhesives for gels and biological tissues", the authors of which are Séverine Rose, Alexandre Prevoteau, Paul Elzière, Dominique Hourdet, Alba Marcellan and Ludwik Leibler, and which appeared in NATURE, Volume 505, page 382 of 16 Jan. 2014.

Another method consists of fixing the moved portion on the structure part that has remained fixed at least partly on the basis of a recreation of hydrogen bonds at the layers in contact.

The principle of such a fixing and the conditions of use will be found for example in the following publication: Routes to Hydrogen Bonding Chain-End Functionalized Polymers, Arthur Bertrand, Frédéric Lortie, Julien Bernard, which appeared in Macromolecular Rapid Communications, Volume 33, Issue 24, pages 2062-2091, 21 Dec. 2012.

According to one embodiment, the fixing of the moved portion on the structure part that has remained fixed is at least partly based on a flow of the layers in contact.

The principle of fixing by flow of two layers and the conditions of use will be found for example in the following publication: "Towards the development of novel compliant and paramorphic substrates for the heteroepitaxy of materials with a difference in mesh"; Marek Kostrzewa, Guy Hollinger; École centrale de Lyon, Electronics, Optoelectronics and Microsystems Laboratory (Ecully, Rhône).

The fixing techniques mentioned above, self-healing, the associations of polymers by hydrogen bonds and flow have many advantages, including the following: The association takes place at low temperature. The materials are compatible with those in microelectronics. These polymers and gels allow planarisation and therefore adjustment. If regions are provided with and without the two faces to be fixed, alignment with better precision will be afforded. For some gels it will be possible to go as far as the recognition of particular functions/bonding for self-alignment in the plane x, y and along the z axis. The particular points for using these techniques will be conventional and widely used machines, for example spin-on, or even machines of the Langmuir type for interface monolayers (such as silicon particles). The temperatures of use do not need to be high. They allow the use of low-temperature embossing systems. The temperature will be a little higher for flow. For example 400° C. for PGS and BPSG glasses.

Alternatively or in a complementary, the fixing of the moved portion on the structure part that has remained fixed is partly based at least on attraction forces, for example van der Waals.

Alternatively or in a complementary, the positioning of the moved portion on the structure part that has remained fixed is partly controlled at least by self-positioning by affinity of material. This technique is also referred to as "self-aligned monolayer".

Moreover, in order to promote the interaction between the two layers, a step of nanoembossing between the second layer and the structure that has remained fixed and on which the second layer is fixed can be performed.

This mechanical compression step of the nanoembossing type can optionally then be performed, according to the type of coiling obtained after release of the stresses, in order to fix the structure.

FIG. 3 illustrates an advantageous implementation of the invention in which the resumptions of contact 310 on the transistors of the 220 type are affected, after turning over, from the bottom face, the one that was in contact with the sacrificial layer and has become accessible. With regard to the resumption of contact, reference can be made to the American patent U.S. Pat. No. 7,556,995, bearing the title "MOS Transistor Manufacturing" granted on 7 Jul. 2009.

FIG. 4 illustrates the fact that it is then optionally possible to cut 410 the structure that is folded by means of a photolithography operation followed by etching in order to isolate the 3D blocks from each other.

This figure also illustrates the removal by lithography of the part 320 illustrated in FIG. 3 and which comprises the portion of the stressed layer 239 forming the junction between the structure that has remained fixed and the structure that has been moved and fixed on the one that has remained fixed.

FIGS. 5a to 5g show that the method of the invention makes it possible to obtain a 3D stack of more than two levels.

Figure 5E:
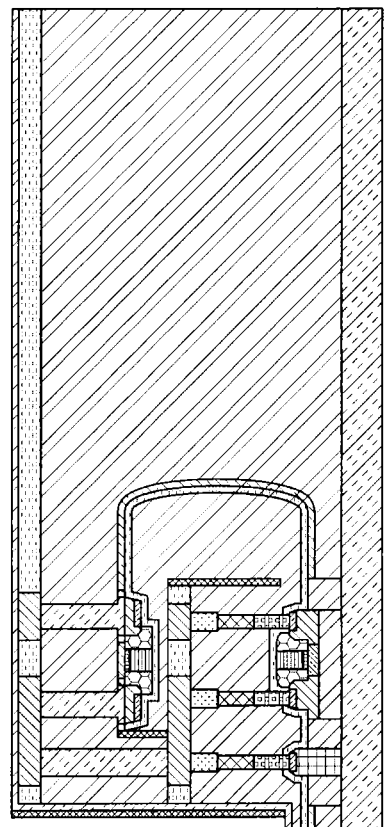
FIG. 5, composed of FIGS. 5a to 5g, shows how the method of the invention makes it possible to obtain a 3D stack of more than two levels.
Figure 5F:
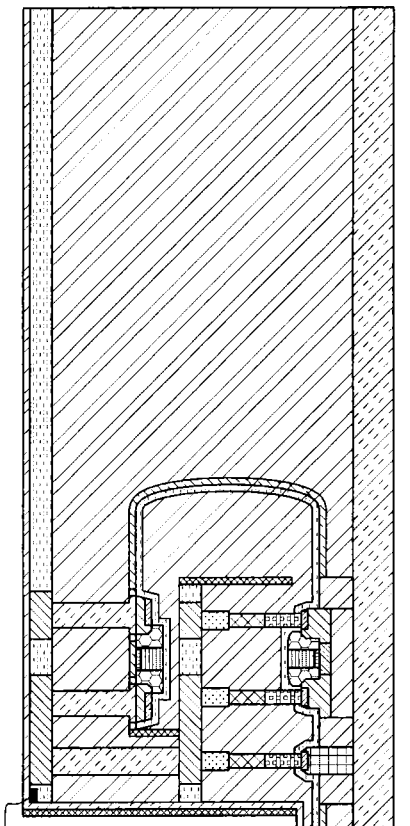
Figure 5G:
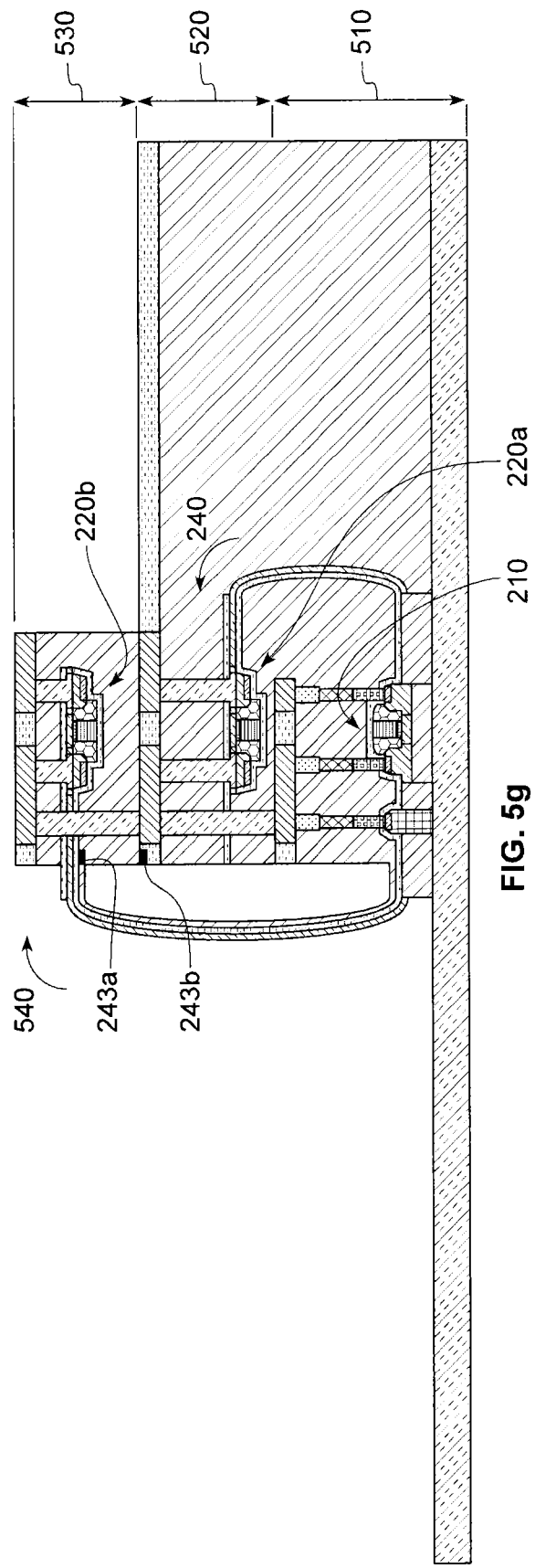

As shown in FIG. 5g, the levels produced in this example are three in number, that is to say: 510, 520 and 530, which are obtained by means of two foldings carried out successively. Each of these levels possibly comprises one or more microelectronic patterns. In the example illustrated, the levels 510, 520, 530 comprise respectively the transistors 210, 220a, 220b.

As described previously in FIGS. 2a to 2e, first of all a first folding 240 is carried out then, after formation of the resumptions of contact on the level 520, for example as described in FIG. 3, it is possible to perform a second folding 540 in a similar way.

FIG. 5a illustrates the fact that the components intended to be folded are, as already described, produced on the same level 230 during the same series of manufacturing steps. However, they are produced at different distances, 501 and 502, from the non-folded components 210. The distance takes account of the level on which they will be folded, and the higher the level, the greater the distance.

FIG. 5b is similar to FIG. 2e and illustrates the structure after the first folding 240 resulting from the partial etching of the sacrificial layer 236 that releases the stress on the layer 239 and enables the latter to be moved. To cause the movement of the layer 239 supporting the devices 220a of only one of the levels (here the level 520), there are performed, prior to the etching of the sacrificial layer 236, lithography steps that make it possible to access, during etching, only the portion of the sacrificial layer 236 retaining the stressed layer 239 supporting the devices 220a of only one of the levels (here the level 520), while preventing removal of the portion of sacrificial layer 236 retaining the stressed layer 239 supporting the devices 220b of the other levels (here the level 530). In summary and with reference to FIG. 5b, in order to form the level 520, the sacrificial layer 236 situated to the right of the device 210 is eliminated and the sacrificial layer 236 situated to the left of the layer device 210 is preserved.

As shown in FIG. 5c, next a resumption of contact 310 of the folded devices 220a is proceeded with, for example, as already described in FIG. 3. It should be noted that these operations may comprise standard steps normally used during the manufacture of microelectronic devices including a deposition of thick oxide of the PMD type, the acronym for "pre-metal dielectric"), flattening of the surface by thinning and chemical mechanical polishing methods and the production at this level of metal interconnections between components.

FIGS. 5d, 5e and 5f illustrate the preparation of the regions intended to be folded in order to form the third level 530. The method is no different from what was described for preparing the first folding in FIGS. 2b, 2c and 2d.

In particular, it is possible to provide for the use of alignment marks 243a, 243b for facilitating and controlling the positioning of the devices 220b on the lower levels 510, 520.

As already indicated, FIG. 5g shows the structure obtained after the second folding resulting from a partial etching of the sacrificial layer 236, production of the resumptions of contacts at this level and optional removal of the nitride spacers during the various turnings.

From the same basic structure it is possible to obtain a structure with several stages in a single step or in a plurality of steps.

In the previous example, the sacrificial layer 236 was first of all eliminated in line with the patterns 220a and then, after folding of these patterns 210a, the sacrificial layer 236 was eliminated in line with the patterns 220b.

FIGS. 5a to 5g correspond to a case where 502>501 and where the three devices (210, 220a and 220b) are on the same line. In order to produce this stacking, two lithographies carried successively will preferably be necessary.

According to another embodiment, it will be possible to effect the elimination of the sacrificial layers 236 simultaneously. The different lengths of these layers in the plane x, y make it possible to have successive stackings of the structures despite an etching initiated simultaneously. This simplifies the method.

In the previous example, structures are stacked aligned in the same direction, here the direction x.

It may be advantageous to proceed in this way with non-aligned patterns 220a, 220b forming for example an angle at 90° with the structure that has remained fixed. For example, a first movement/rolling is made in the plane z, x and a second movement/rolling is made in the plane y, z.

In this case, it is possible to successively remove the sacrificial layers each retaining patterns 220a, 220b.

According to one advantageous embodiment, it is possible to simultaneously trigger the removals of the various portions of sacrificial layers 236.

For this purpose, advantage can be taken for example of the crystalline orientations of the sacrificial layer 236, which have different etching speeds.

For example, a first sacrificial layer portion lying in the plane x, y and in the direction x has an etching speed significantly greater than that of a second sacrificial layer portion lying in the plane x, y and in the direction y. The patterns surmounting the first sacrificial layer portion will therefore be moved and folded before those surmounting the second sacrificial layer portion.

Thus the invention advantageously makes it possible to perform rollings on two or even more different rotation axes.

This makes it possible to increase the number of final structures that it is possible to obtain. For example, it makes it possible to obtain structures with a high number of levels, typically greater than three. With patterns distributed at 90° around a structure intended to remain fixed, it is thus possible to easily obtain four levels above this structure intended to remain fixed.

Figure 6:
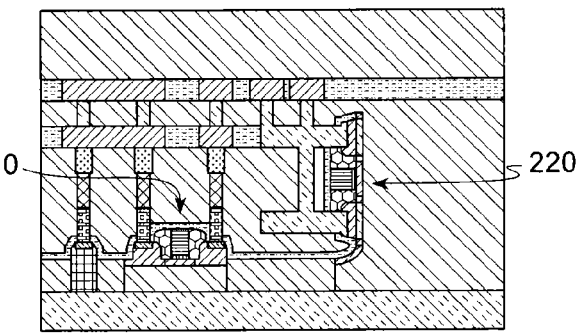
FIG. 6 illustrates the fact that the patterns are possibly positioned vertically after folding by a folding for example of approximately 90°.

FIG. 6 illustrates the fact that the folding can be done so that, at the end of this operation, the folded components are in a vertical position 610 as depicted, or even that they occupy any angle.

Here the pattern 220 is thus transferred to 90° on the structure that has remained fixed and bearing the pattern 210.

Figure 7:
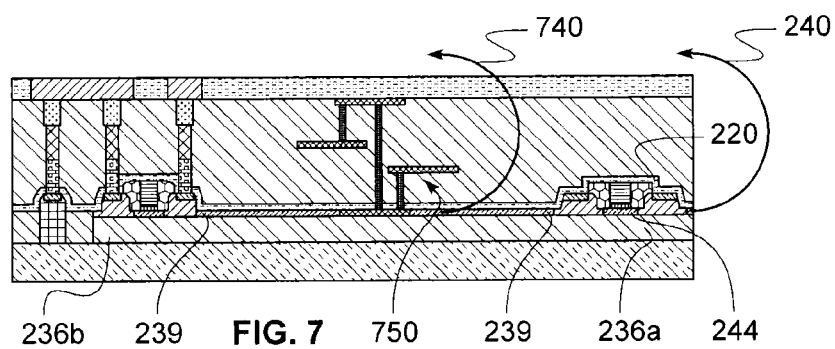
FIG. 7 illustrates the fact that it is also possible to proceed with the folding of interconnection blocks.

FIG. 7 shows that it is possible to proceed not only with folding 240 of active components 220, as already illustrated in the previous figures, but also a folding 740 of interconnection blocks 750 that will also have been produced previously on the first level.

This embodiment thus clearly illustrates that the patterns intended to be moved by relaxation of the stress in the layer 239 may be of various natures: active components, interconnection block, etc.

If the pattern 220 is above the interconnections 50, it is possible either:

To start from a structure in which the interconnection block 50 and the pattern 220 are positioned in different directions, for example at 90°; then to fold the interconnection block 50 and next the pattern 220. The two movements are then contained in two different planes z, y and y, z.

To start from a structure in which the interconnection block, pattern 220 and fixed structure are positioned on the same line and in which the interconnection block 50 and the pattern 220 are positioned on either side of the fixed structure and at different distances from the fixed structure (as in the case illustrated in FIGS. 5a to 5g); then to fold the interconnection block 50 and next the pattern 220. The two movements are thus contained in the same plane z, x.

To start from a structure in which the interconnection block, pattern 220 and fixed structure are positioned on the same line and in which the interconnection block 50 and the pattern 220 are positioned on the same side of the fixed structure. The two movements are thus contained in the same plane z, x. This is the case that is illustrated in FIG. 7.

Figure 8:
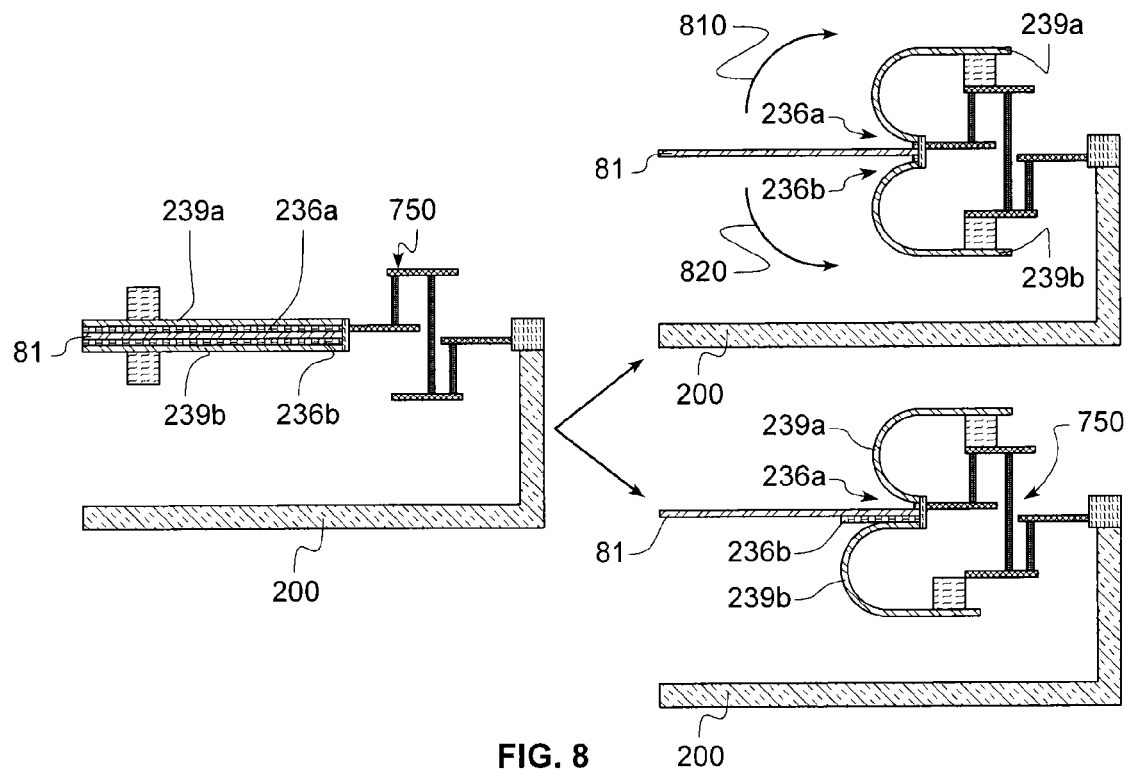
FIG. 8 illustrates an embodiment of 3D structures that uses two types of folding in opposite directions.

FIG. 8 illustrates an embodiment of 3D structures according to the invention that uses two types of folding in opposite directions. According to the mechanical stresses created in the folded layers, it is possible in fact to obtain, as illustrated up until now, a folding in a first direction 810, that is to say upwards in FIGS. 1 to 8. It is also possible to obtain a folding in a second direction 820 opposite to the first direction 810, that is to say downwards. These two movements are contained in the same plane z, x.

Thus, in a single etching of the sacrificial layers 236a, 236b, it is possible to obtain foldings in two different directions.

The starting structure comprises for example a support layer 81 having:
a top face covered with a sacrificial layer 236a and a stressed layer 239a covering the sacrificial layer 236a.
a bottom face covered with a sacrificial layer 236b and a stressed layer 239b covering the sacrificial layer 236b;

It should be noted that, according to the etching time for each of the sacrificial layers 236a, 236b or their nature, it is possible to obtain foldings having various configurations.

For example, from the same structure illustrated on the left in FIG. 8, it is possible to obtain, on either side of the support 81, symmetrical layers 239a, 239b (figure at top right) if the sacrificial layers 236a, 236b are identical and etched identically.

From this same structure illustrated on the left in FIG. 8, it is also possible to obtain, on either side of the support 81, non-symmetrical layers 239a, 239b (figure at bottom right) if the sacrificial layers 236a, 236b are etched differently, for example if the sacrificial layer 236b is not completely etched.

This embodiment thus makes provision for releasing space below the support layer 81 for folding downwards. This is easy using an SOI substrate where the space will have been created under the buried oxide layer (BOX) prior to the folding.

FIGS. 9a to 9d illustrate the use of notches intended to control the foldings.

FIG. 9a shows the prior creation of a discontinuity, preferably in the form of a notch 910 that will next, as shown in FIG. 9b, control a folding of the component 920 into the vertical position. The notch 910 situated between a structure 210 positioned on the fixed part and a structure 220 positioned on the movable part.

According to an advantageous embodiment, the notch 910 is obtained by producing a cavity by lithography and then filling this cavity with a dielectric material. This then forms a block 911 illustrated in FIG. 9a situated at the top of the page.

Before elimination of the sacrificial layer 236, the material filling the cavity is voided so as to form the notch 910.

The notch 910 serves as a stop even in the case where a space 930 would remain after folding of the component 920 into the vertical position. Advantageously, the stop suffices to block the rolling in the correct position.

FIGS. 9c and 9d show the use of two discontinuities formed by folding notches. At least a second notch 940, created in advance, serves as a stop for a second folding 950. It is then possible to more easily effect the folding and control the positioning of the patterns 220a and 220b.

FIGS. 10 to 13 illustrate examples of structures in which the second layer comprises at least one discontinuity formed by a folding notch. These figures illustrate advantageous distances according to the patterns to be moved and the structure that it is wished to obtain in the end.

FIGS. 10 and 11 illustrate a single movement about an angle of approximately 90°.

Figure 10A:
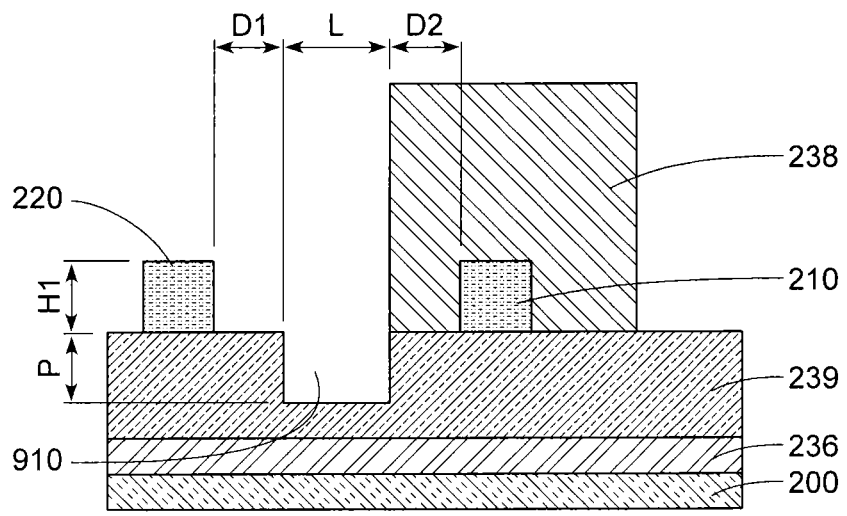
FIG. 10, composed of FIGS. 10a and 10b, illustrates another example embodiment in which notches are used to control the foldings.
Figure 10B:
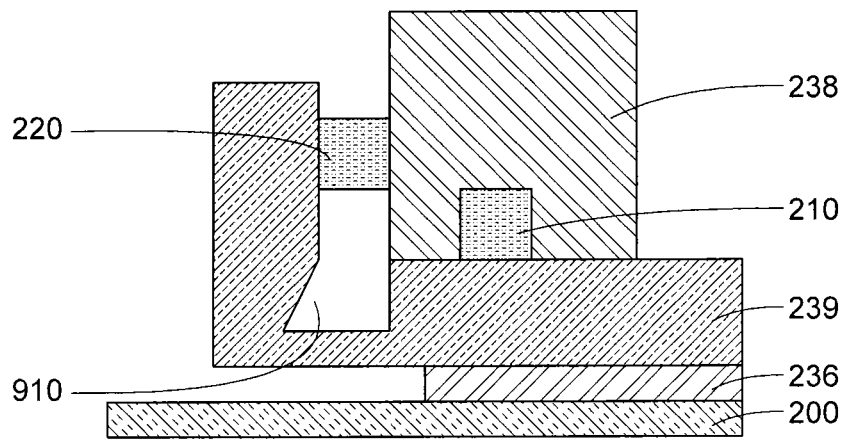

In FIGS. 10a and 10b the elimination of the layer 236 releases the stresses on the layer 239, which causes the rotation of the pattern 220 substantially about the notch 910.

Preferably, the width L of the notch 910 is substantially similar to the distance D1 separating the notch 910 from the pattern 220. Typically this distance is 20 nanometers. The depth of the notch is denoted P.

H1 corresponds to the height of the pattern 220. This height is measured between the top of the pattern 210 and the top face of the second layer 239.

D2 is the distance separating the fixed pattern 210 from the flank of the masking block 238. D2 corresponds for example to the distance necessary for the formation of the source and drain on either side of the pattern 210 when the latter is a transistor. D2 is for example equal to 20 nm.

In this example the movement is stopped by the pattern 220 coming into abutment on the structure that has remained fixed (in this non-limitative example the block 238).

Figure 11A:
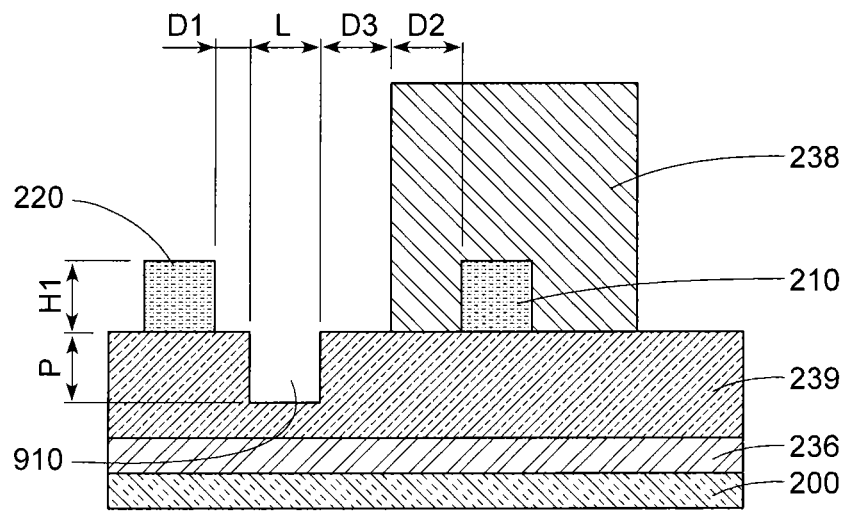
FIG. 11, composed of FIGS. 11a and 11b, illustrates another example embodiment in which notches are used to control the foldings.
Figure 11B:
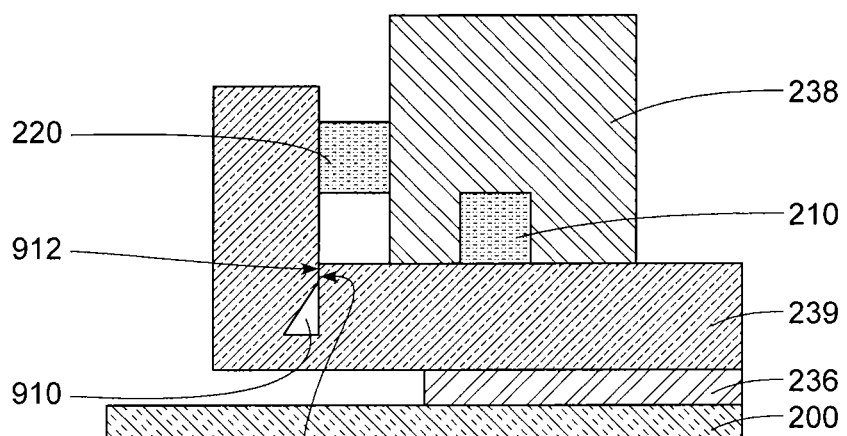

In FIGS. 11a and 11b, D3 is the distance separating the masking block 238 from the notch 910.

In this example D3, L, P and H1 are such that the notch 910 forms a stop that stops the movement of the pattern 210. Typically D3=H1 as illustrated or D3>H1.

During the rotation under the effect of the release of the stresses on the layer 239, the top corner 912 of the notch 910 turned facing the part that moves of the layer 239 comes into abutment against the opposite flank 913 of the notch 910. The rotation is stopped by this coming into abutment of the two opposite flanks of the notch. This thus makes it possible to very precisely control the movement of the pattern 220.

If on the other hand it is wished for the end-of-rotation abutment to take place when the pattern 220 is fixed on the fixed structure 238, 210, then D3<H1. In this case the contact is first of all established between the movable pattern 220 and the fixed structure 238, 210 as illustrated in FIG. 10.

Naturally, in all its FIGS. 10 and 11, the second layer 239 can carry several patterns 210, and the distance D1 is then the distance between the notch 910 and the pattern closest to the latter. H1 is the height of the highest pattern among the moved patterns.

Figure 12A:
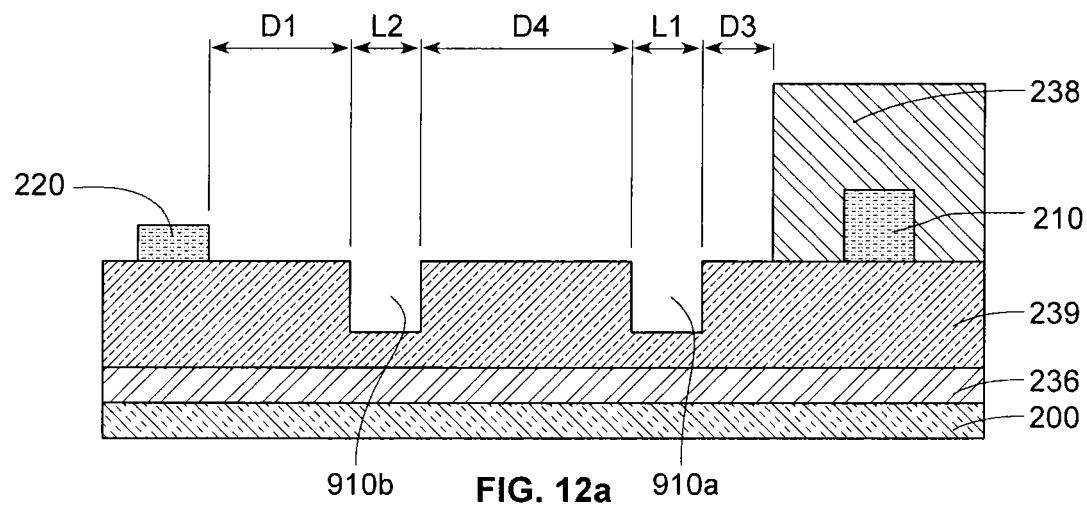
FIG. 12, composed of FIGS. 12a and 12b, illustrates another example embodiment in which notches are used to control the foldings.
Figure 12B:
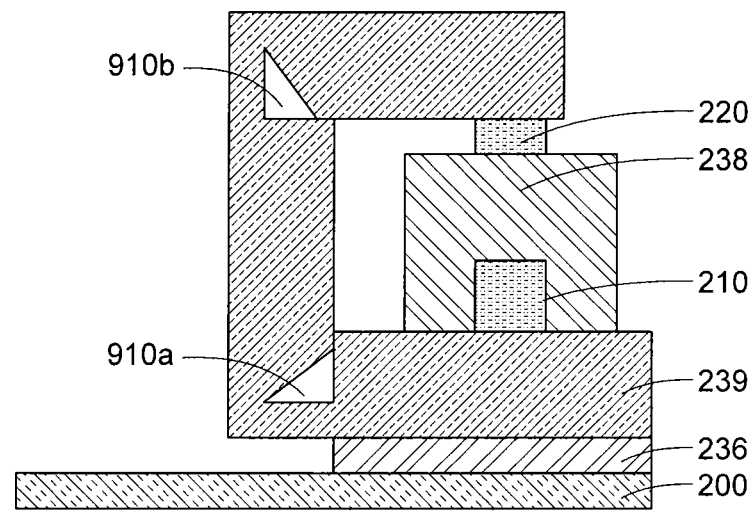

FIG. 12 illustrates two successive movements, in the same direction and about an angle of approximately 90°, of part of the second layer 239 situated on the same side as the part 238 that has remained fixed on the layer 239.

In FIG. 12a, the second layer 239 carries two notches 910a and 910b. D4 is the distance separating the two notches 910a, 910b. D1 is the distance separating the pattern 220 to be moved from the notch that is closest to it. H2 is the height of the structure on the top of which it is necessary to fix the pattern 220. Here H2 is the height of block 238 that encapsulates the pattern 220. Naturally this block 238 is not limitative and, if it is not present, H2 corresponds to the height between the top face of the layer 239 and the top of the highest pattern 210 intended to remain fixed. L1 and L2 are the widths of the notches 910a and 910b.

In order to position the pattern 220 on the top, two rotations take place at the notches, each by approximately 90° and in the same rotation direction. Moreover, preferably D4>H2. Preferably D3>0 in order in particular to avoid having the notch 910a partly under the block 238 in the case of a lack of precision in the method.

Figure 13A:
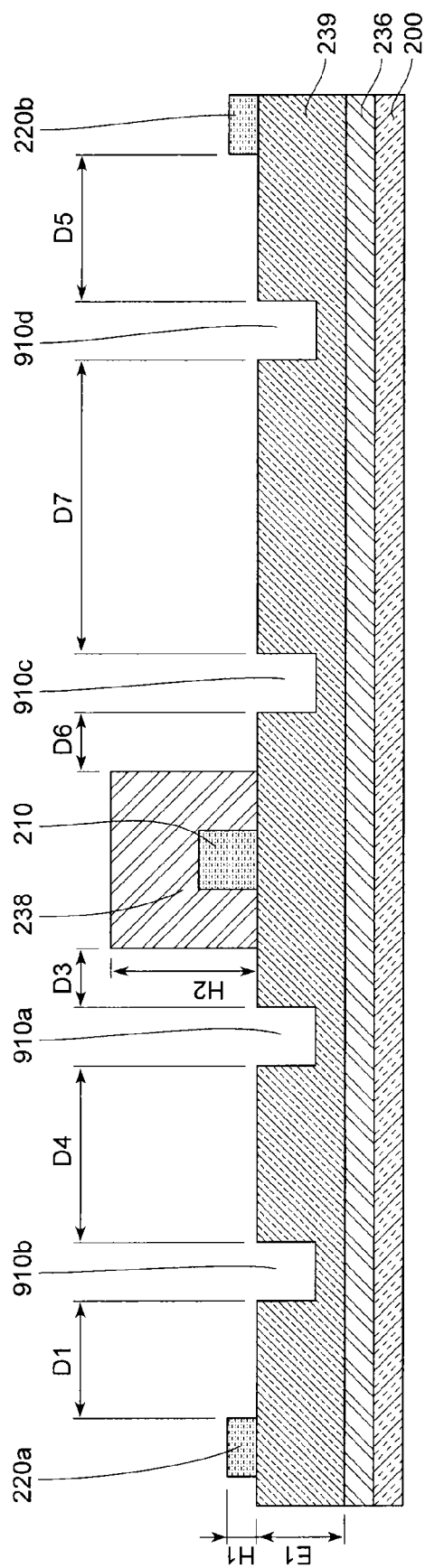
FIG. 13, composed of FIGS. 13a and 13b, illustrates another example embodiment in which notches are used to control the foldings.
Figure 13B:
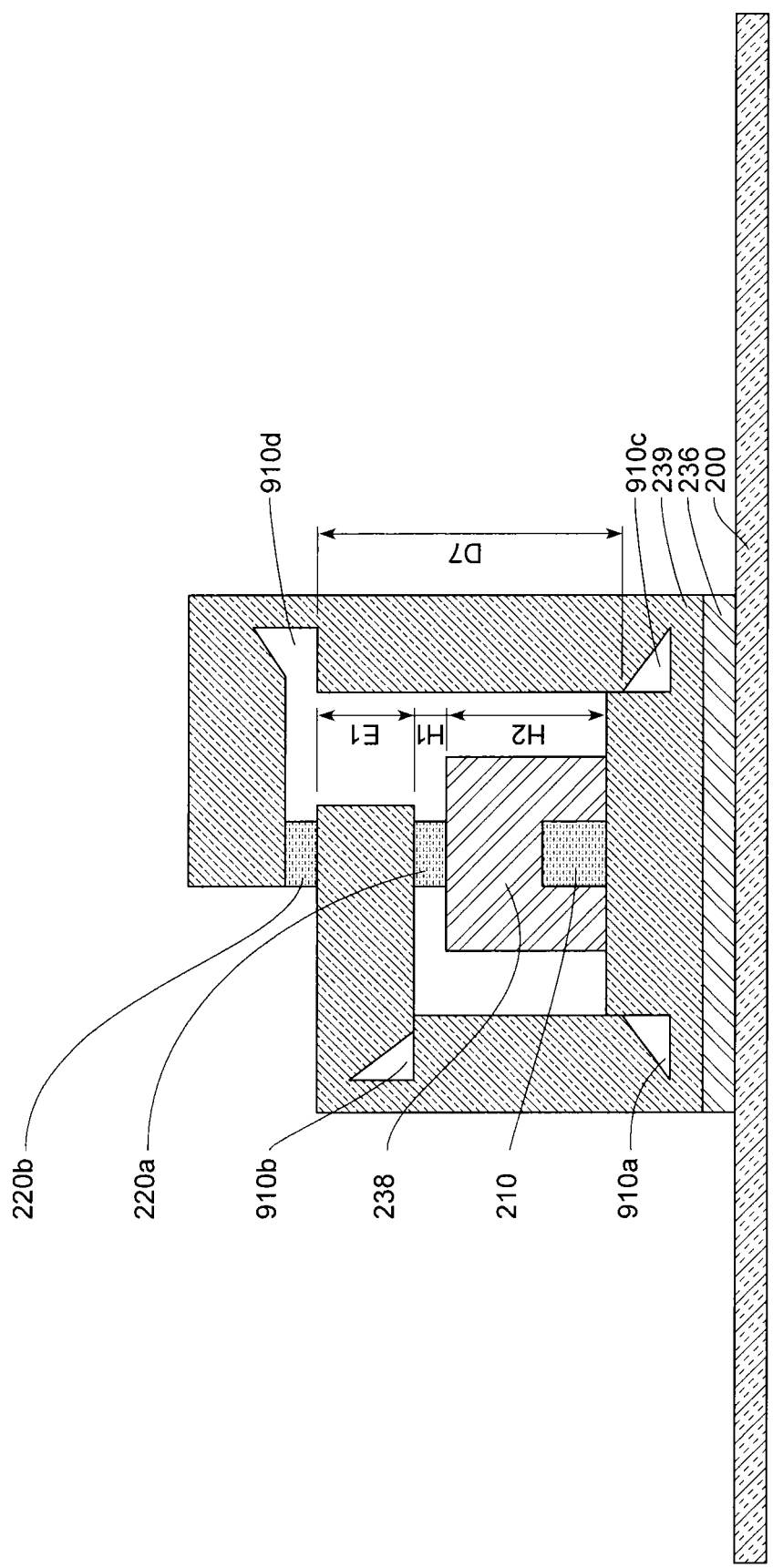

FIG. 13 illustrates two successive movements, about an angle of approximately 90° and in a first direction, of a part of the second layer 239 carrying the pattern 220a and situated on a first side of the part that has remained fixed of the layer 239, and then two successive movements, about an angle of approximately 90° in a second direction opposite to the first direction, of a part of the second layer 239 carrying the pattern 220b and situated on the other side of the part that has remained fixed of the layer 239.

For the part of the second layer 239 carrying the pattern 220a, i.e. the part of the second layer 239 that moves first, the length conditions in particular are the same as those described in FIG. 12.

For the part of the second layer 239 carrying the pattern 220b, i.e. the part of the second layer 239 that moves second, D7 is greater than or equal to H2+H1+E1, D7 being the distance between the notches 910c and 910d; E1 being the thickness of the part of the second layer 239 that moves first and covers the top of the block 238.

Preferably, for a notch, P<L<2*P, with P and L the depth and width of the notch respectively.

Several features of the invention are mentioned below. This information can be combined with each of the embodiments described above:

Concerning the materials used:

The substrate is taken from Si, Ge, SiGe, or a substrate of the SOI (silicon on insulator) type.

Preferably, the sacrificial layer, also referred to as the first layer 239, is formed by epitaxy or by molecular bonding. It is for example made from AlAs with a thickness of 20 nm to 50 nm or Si with a thickness of 30 nm to 70 nm, preferably 50 nm.

Preferably, the stressed layer, also referred to as the second layer 236, is formed by epitaxy or by molecular bonding. It is for example made from GaAs with a thickness of 10 to 25 nm, preferably 14.6 nm, or from $Si_{0.64}Ge_{0.36}$ with a thickness of 10 nm to 30 nm.

Preferably, the layer that will define the properties of the transistor (layer 244 in FIG. 2b or 7) is formed by epitaxy or by molecular bonding. It is for example made from $In_{0.33}Ga_{0.67}As$ with a thickness of 10 nm to 20 nm and preferably 14 nm, or from Si with a thickness of 5 nm to 20 nm and preferably 10 nm.

The pair formed by the material that holds or releases the stress (the material of the first layer) and that which will define the material functionality of the second layer) is related directly to the type of rolling that it is wished to carry out. This is because, depending on the thickness of the pair, there will be a direct correspondence with the diameter of the rolling.

Several other features of the invention are mentioned below. These features are optional. They may be used with each of the embodiments described above.

Concerning the configuration of the structure and the steps of the method:

The siliciding may take place in continuity with or after the turning over of the moved pattern 220 according to the connections sought and the direction in which the final transistor will be situated (upwards or downwards).

In the present description, the module carrying the pattern 220 to be moved is also designated the "rolling module". Depending on the application sought, the interconnection lines of the back-end type will be produced or not before the rolling module, with the materials tungsten (W), aluminium (Al), and copper (Cu).

For the rolling, it is necessary to encapsulate all the devices (and more generally all the patterns 220) and interconnections 750; to do this the film 238 of the PMD (Pre Metal Dielectric), TEOS (tetraethyl orthosilicate) or BPSG (borophosphosilicate glass) type having a thickness at least 25% greater than the thickness that corresponds to the relief to be encapsulated will be deposited. A polishing or annealing step at a suitable temperature depending on the presence of metals or not (in this case 400° maximum) would be possible according to the degree of planarisation required.

Concerning the encapsulation material particular to this novel rolling method, it may have various properties according to the future use:

it may simply be sacrificial of the "oxide" type, typically in TEOS in order to leave space for the connections, growth, etc.

it may be a polymer of the thermoplastic type in order to damp the contact and adsorption. Materials such as PEN or PET could be used for this purpose.

the material may be conductive; this is because, if the transistor that will be rolled has these conductive surface and current, after turning over it will be possible to use this turned over transistor as a hard mask to leave this conductive encapsulation, which will directly contact, in a self-aligned manner, the transistor and the devices that are not turned over (transistor or interconnections).

Next it is possible to repeat an alignment mark.

Concerning the rolling module:

The first key point will indeed be with regard to the design for the opening of the encapsulation material. This will be done in close connection with the type of turning over required. Some types of turning over and particular designs have been mentioned above.

This is directly related to the function to be positioned above the remaining structures in the correct direction. Therefore the height of the second device will depend on the space/distance between the two. The larger the interconnection lines, the greater will have to be the distance in order to end in an overhang, as illustrated in FIGS. 5a to 5g.

The encapsulation material will therefore be etched as well as the active epitaxy level and the one that defines the stress 239 in order to emerge on the sacrificial layer 236. Depending on the mesh of the first layer 236, the second layer 239 will be stressed to a greater or lesser extent. The mesh depends firstly on the nature of the material. It may also depend on its thickness and the crystalline lattice below.

Next spacers 234 will be produced, formed by a fine deposit of conforming oxide or nitride of a few nm in order to protect the flanks in advance of the etching of the sacrificial material. A plasma etching of the anisotropic type with detection of end of etching will be carried out ($CHF_3$—$CF_4$ gas with $O_2$ or $N_2$). The absence of any spacer 234 is also possible but will make the etching of the sacrificial material more complex (there will be either a large isotropic hole or it will be necessary to use the crystalline orientation condition, which will be a limit to the design possible).

Next the operation of etching the sacrificial film will be performed in time either:

by wet etching: for example HBr at 50% by volume; $K_2Cr_2O_7$ at 0.5 moles/liter; $CH_3COOH$ at 100% by volume. The solution has a ratio of 2:1:1 for respectively HBr, $K_2Cr_2O_7$ and $CH_3COOH$. The solution thus formed is referred to as BKC-211;

or by a dry etching based on HCl in order to have great selectivity between the Si and the SiGe (preferably greater than 20. This will be possible with a Ge concentration of between 25% and 35%). During this operation, the turning-over/rolling phenomenon will take form.

A mechanical compression step of the nanoembossing type may take place or not depending on the type of rolling in order to fix the situation.

The next step will be making contact with the standard methods of dielectric deposition and photolithography and etchings that will stop of the sacrificial layer 236, which therefore manages the stress like a material of the IIIN or column IV type. The selectivity will at a minimum be 10 with etching gas such as $CH_3F$ or $C_4F_8$ and depending on the passivation chosen: nitride or oxide type.

Next this stop layer will be etched in order to reach the active layer or the silicide and then the end of the interconnections will resume in order to conclude with a concatenation of the standard microelectronic steps for Back-End.

Depending on the nature of the material and its doping, it will be possible to produce active transistors of the n or p type in column IV or III/V. It may be a case of the channel or of the earth plane part.

It will also be understood clearly that, if the order of the stacking is reversed, it is not a roll-up action but a rolling of the roll-down type.

It will also be possible to combine these roll-up and roll-down actions: by judiciously selecting the starting structure and effecting several rolls following each other in space (in the same direction or not). Thus there will be devices which, after the two rollings, will always be head to tail or will once again be in the correct direction. This is particularly advantageous for questions of contact, isolation and siliciding.

The rolling, whether it be up or down or a combination of rolls, must be able to positioned in space and for the device with a required orientation (head to tail or not). To do this, several techniques can be used alternatively or cumulatively in the context of the invention; depending on the application, the most suitable technique will be selected.

There is the cylinder type, the one that is described in the literature where the thickness of the epitaxy stack is directly associated with the final diameter of the roll up. This makes it possible to know how the device will be oriented after the rolling operation. There is less flexibility and therefore more risk that the turning over will not be flat (parallel to the substrate). To do this there will be the multi-stress type where the stress is directly associated with the maximum rotation angle. For each 90° there will be a different sacrificial material.

There will also be the "notch" type where in the original structure trenches or mini-trenches will have been added on top of the film that manages the stress trenches or mini-trenches. Thus, depending on the aspect ratio of the said trenches or mini-trenches, the rolling will be controlled by a stop. During the movement caused by the relaxation of the stress, e.g. during the rolling, the top corner of one of the flanks of the trench comes into contact with the opposite flank and thus blocks the rolling or rotation. It is thus possible to adjust the flatness of the vertical and horizontal regions.

Another type involves the presence of "support pins". Before the start of the rolling, support pins will be produced with different heights or not in order thus to have guidance or blocking of the system that will see the winding. The support pins thus act as stops that block the rolling. Thus the structure of the rolling will be defined in space. It will next be possible to adjust it by selective removals of these pins.

The three techniques are relatively simple to implement and make it possible to position the movable module on the module that has remained fixed with greater precision.

The invention is not limited to the embodiments described above and extends to all embodiments covered by the claims.

The invention claimed is:

1. A method for producing a multilevel microelectronic structure, comprising at least:
    the formation of a first layer;
    the production of at least one second layer at least partially covering the first layer;
    the production of at least one microelectronic pattern on or in the second layer; wherein:

the second layer is formed so as to generate a mechanical stress in it; the first layer forms for the second layer a support preventing relaxation of said stress; and comprising at least the following steps performed after the production of at least one microelectronic pattern, elimination of at least part of the first layer, thus making it possible to relax at least part of the mechanical stress on the second layer so that at least a portion of the second layer covering said eliminated part of the first layer and carrying said at least one pattern moves;

fixing the moved portion of the second layer to a structure part that has remained fixed; and wherein, prior to the elimination step, at least one notch is produced in the second layer configured so as to control the position of the moved portion of the second layer on the structure part that has remained fixed.

2. A method according to claim 1, wherein the at least one notch blocks the movement of the moved portion of the second layer.

3. A method according to claim 1, wherein the at least one notch defines a center of rotation about which the moved portion of the second layer turns when it moves.

4. A method according to claim 1, wherein the at least one notch has opposing flanks which come in contact to block the movement of said moved part of the second layer.

5. A method according to claim 1, wherein the at least one notch is formed between the pattern and the structure part intended to remain fixed, and wherein said at least one notch forms a stop configured so as to block the movement of said moved part of the second layer.

6. A method according to claim 5, wherein the at least one notch forms a trench.

7. A method according to claim 1, wherein the second layer comprises at least one first microelectronic pattern on said moved portion of the second layer and at least one second microelectronic pattern on a portion of the second layer that has remained fixed and wherein, at the end of the fixing of said moved portion of the second layer to the part of the structure that has remained fixed, the first and second patterns are superimposed.

8. A method according to claim 1, wherein the second layer comprises at least one microelectronic pattern on said moved portion of the second layer or on a portion of the second layer that has remained fixed.

9. A method according to claim 1, wherein the second layer comprises at least one microelectronic pattern on said moved portion of the second layer and at least one microelectronic pattern on a portion of the second layer that has remained fixed.

10. A method according to claim 1, wherein the portion of the second layer covering said eliminated part of the first layer moves while curving under the effect of the relaxation of said stress.

11. A method according to claim 1, wherein the second layer is covered with an insulating layer configured so as to allow itself to be moved by the movement of the second layer.

12. A method according to claim 11, wherein the insulating layer is surmounted by a semiconductor layer, configured so as to allow itself to be moved by the movement of the second layer.

13. A method according to claim 1, wherein the moved portion of the second layer curves in the direction of a portion that has remained fixed.

14. A method according to claim 1, wherein the moved portion of the second layer curves by an angle in a range of 60° and 270° and preferably in a range of 80° and 190°.

15. A method according to claim 1, wherein the moved portion comprises at least one active component.

16. A method according to claim 1, wherein the moved portion comprises at least one transistor.

17. A method according to claim 1, wherein the moved portion comprises at least one component taken from the following components: a logic component, a memory cell, an electromechanical microsystem (MEMS), a nanometric electromechanical system, a sensor, an imager, a lab on chip, a photonic component, an acoustic component, a phononic component or a bioelectronic component.

18. A method according to claim 17, wherein the transistor carried by the moved portion is attached to the rest of the structure while forming an angle in a range of 80° and 190° with respect to its initial position.

19. A method according to claim 1, wherein the structure portion that has remained fixed comprises at least one active component.

20. A method according to claim 1, wherein the structure portion that has remained fixed comprises at least one transistor.

21. A method according to claim 1, wherein the fixing of the moved portion of the second layer to the structure part that has remained fixed is based at least partly on a self-healing of the layers in contact.

22. A method according to claim 1, wherein the fixing of the moved portion to the structure part that has remained fixed is based at least partly on a flow of the layers in contact.

23. A method according to claim 1, wherein at least first and second patterns are produced on the second layer, said structure part intended to remain fixed and the first and second patterns being aligned, and in which the first and second patterns are moved successively onto said structure part intended to remain fixed.

24. A method according to claim 1, wherein at least first and second patterns are produced on the second layer, said structure part intended to remain fixed and the first and second patterns being aligned, the first and second patterns being disposed on either side of said structure part intended to remain fixed and at different distances therefrom.

25. A method according to claim 1, wherein at least first and second patterns are produced on the second layer, said structure part intended to remain fixed and the first and second patterns being aligned, the first and second patterns being disposed on the same side of said part intended to remain fixed and at different distances therefrom.

26. A method according to claim 1, wherein at least first and second patterns are produced on the second layer, and in which movements of the first and second patterns are made in different planes.

27. A method according to claim 1, wherein both a first layer and a second layer are disposed on each of two opposite faces of a support layer and in which the elimination of the first layers causes the movement of the second layers in the same plane and on either side of the support layer.

28. A method according to claim 1, wherein there is produced, in the structure part intended to remain fixed, at least one contact pin serving as a stop configured so as to block the movement of said moved part of the second layer.

29. A method for producing a multilevel microelectronic structure, comprising at least:
the formation of a first layer;
the production of at least one second layer at least partially covering the first layer;
the production of at least one microelectronic pattern on or in the second layer; wherein:

the second layer is formed so as to generate a mechanical stress in it; the first layer forms for the second layer a support preventing relaxation of said stress;

and comprising at least the following steps performed after the production of at least one microelectronic pattern, elimination of at least part of the first layer, thus making it possible to relax at least part of the mechanical stress on the second layer so that at least a portion of the second layer covering said eliminated part of the first layer and carrying said at least one pattern moves;

fixing the moved portion of the second layer to a structure part that has remained fixed;

wherein, prior to the elimination step, at least one discontinuity is produced in the second layer configured so as to control the position of the moved portion of the second layer on the structure part that has remained fixed; and wherein the fixing of the moved portion to the structure part that has remained fixed is based at least partly on any one of:

a creation of hydrogen bonds at the layers in contact;

van der Waals forces, and a nanoembossing step.

30. A method for producing a multilevel microelectronic structure, comprising at least:

the formation of a first layer;

the production of at least one second layer at least partially covering the first layer;

the production of at least one microelectronic pattern on or in the second layer; wherein:

the second layer is formed so as to generate a mechanical stress in it; the first layer forms for the second layer a support preventing relaxation of said stress;

and comprising at least the following steps performed after the production of at least one microelectronic pattern, elimination of at least part of the first layer, thus making it possible to relax at least part of the mechanical stress on the second layer so that at least a portion of the second layer covering said eliminated part of the first layer and carrying said at least one pattern moves;

fixing the moved portion of the second layer to a structure part that has remained fixed;

wherein, prior to the elimination step, at least one discontinuity is produced in the second layer configured so as to control the position of the moved portion of the second layer on the structure part that has remained fixed; and, wherein the moved portion of the second layer integrates or carries a microelectronic pattern and the fixing step comprises a step of penetration of said pattern into a deformable layer carried by the rest of the structure, namely by the structure part that has remained fixed.

31. A method according to claim 30, wherein the penetration step comprises an impression step applied to the moved portion so as to cause said pattern to penetrate the deformable layer.

* * * * *